United States Patent [19]

Kaiser

[11] 4,219,827
[45] Aug. 26, 1980

[54] INTEGRATED CIRCUIT WITH METAL PATH FOR REDUCING PARASITIC EFFECTS

[75] Inventor: Reinhold Kaiser, Heilbronn, Fed. Rep. of Germany

[73] Assignee: Licentia Patent-Verwaltungs-G.m.b.H., Frankfurt am Main, Fed. Rep. of Germany

[21] Appl. No.: 3,645

[22] Filed: Jan. 15, 1979

Related U.S. Application Data

[63] Continuation of Ser. No. 763,690, Jan. 28, 1977, abandoned.

[30] Foreign Application Priority Data

Jan. 31, 1976 [DE] Fed. Rep. of Germany ....... 2603747

[51] Int. Cl.$^2$ .................... H01L 23/48; H01L 29/44; H01L 29/52
[52] U.S. Cl. ........................................ 357/68; 357/52; 357/53; 357/65
[58] Field of Search ........................ 357/52, 53, 65, 67, 357/68, 70

[56] References Cited

U.S. PATENT DOCUMENTS

| | | | |
|---|---|---|---|
| 3,404,304 | 10/1968 | Bonin et al. | 357/52 |
| 3,408,542 | 10/1968 | Dautzenberg | 357/56 |
| 3,432,731 | 3/1969 | Whittier | 357/53 |
| 3,436,612 | 4/1969 | Grosvalet | 357/53 |
| 3,601,668 | 8/1971 | Slaten | 357/53 |
| 3,602,782 | 8/1971 | Klein | 357/53 |
| 3,771,217 | 11/1973 | Hartman | 357/53 |
| 3,896,486 | 7/1975 | Wright | 357/67 |
| 3,911,473 | 10/1975 | Nienhuis | 357/53 |
| 4,000,507 | 12/1976 | Nishida et al. | 357/53 |
| 4,041,399 | 8/1977 | Tsuda | 357/53 |

*Primary Examiner*—Andrew J. James
*Attorney, Agent, or Firm*—Spencer & Kaye

[57] ABSTRACT

An integrated circuit comprises a semiconductor body with a metal path running at least partially on the component side surface of the semiconductor body itself.

The invention also includes the method of making the arrangement.

25 Claims, 8 Drawing Figures

INTEGRATED CIRCUIT WITH METAL PATH FOR REDUCING PARASITIC EFFECTS

CROSS-REFERENCE TO RELATED APPLICATION

This application is a continuation of application Ser. No. 763,690, filed Jan. 28, 1977, now abandoned.

BACKGROUND OF THE INVENTION

In integrated circuits, as is known, there is the danger that undesirable parasitic effects may occur and that the individual elements of the integrated circuit may not be sufficiently electrically separated from each other.

SUMMARY OF THE INVENTION

It is an object of the invention to provide an integrated circuit in which parasitic effects are prevented or reduced and in which the electrical separation of the elements, also named components, can be improved.

According to a first aspect of the invention, there is provided an integrated circuit comprising a semiconductor body, an assembly side of said semiconductor from which the elements of the integrated circuit were formed in said semiconductor body and a metal path on said component side of said semiconductor body and extending at least partially in contact with said semiconductor body itself.

Further according to this aspect of the invention, there is provided an integrated circuit characterized in that a metal path is present on the main surface of the semiconductor body on the component side, and runs at least partially along the semiconductor body.

According to a second aspect of the invention, there is provided a method of producing an integrated circuit comprising the steps of forming a scribing recess in an insulating layer provided on the component side of a semiconductor body from which the elements of the circuit were formed in said semiconductor body introducing a metal path into said scribing recess and thereafter scribing said semiconductor body through said metal path.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
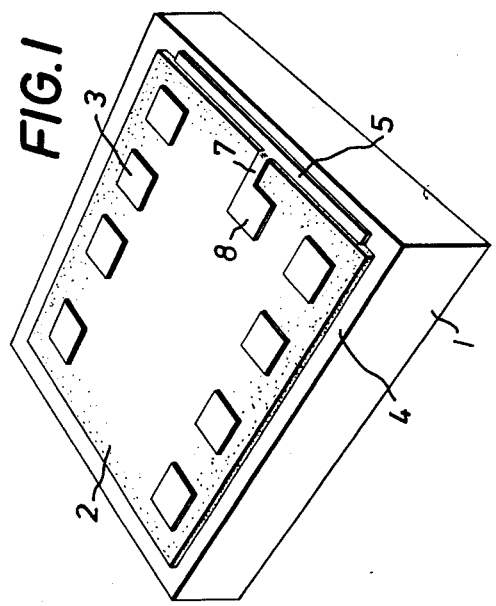
FIG. 1 is a perspective view of a first embodiment of the invention.

In a preferred embodiment of the invention, it is proposed to provide an integrated circuit with a metal path provided on the main surface of the semiconductor body on the component side, the metal path running at least partially on the semiconductor body.

As is known, a semiconductor body for an integrated circuit is disc-shaped.

As is also known, this type of semiconductor body is very thin in comparison to its surface area. For this reason one talks of two large-surface main surfaces on the upper and lower side and of relatively narrow edge surfaces at the edge of the semiconductor body. As is known, the elements of an integrated circuit are introduced into the semiconductor body from one side or from one main surface; this takes place today by means of diffusion or by means of ion implantation. Thus by main surface on the component side is meant that main surface from which the elements or components are introduced into the semiconductor body.

With the metal path provided according to the invention, the part running on the semiconductor body is longer than that part which does not run on the semiconductor body and runs, for example, on the insulating layer. If mention is made here of the fact that the metal path runs on the semiconductor body, then the essential fact to be understood is that the metal path is applied directly to the semiconductor body; however, a solder may be provided between the metal path and the semiconductor body for the purpose of better adhesion, but the metal path is generally applied directly to the semiconductor body, for example by means of vapour deposition.

The metal path preferably runs on the semiconductor body over its entire length or at least over a substantial part of its length. The metal path runs preferably at the edge of the main surface of the semiconductor body. The effect of the invention is greater the longer the metal is, i.e. metal paths are preferably present not only along one edge of the main surface but along two, three or even four edges of the main surface. The metal paths are preferably connected together so that for example rectangular, U-shaped or framelike metal paths are produced.

The metal path runs for example in the recess in the insulating layer provided for scribing the semiconductor wafer. The metal path may also run partially on the insulating layer present on the semiconductor body.

In accordance with an embodiment of the invention, conductive paths are provided, in addition to the metal path which run from the metal path towards the inner part of the main surface and are connected there to connecting points. This is advantageous if, for example, the metal path is at reference potential and if various points in the circuit have to be connected to the reference potential. In contrast to the metal path, the conductive paths run substantially on the insulating layer. The material of the metal path is, for example, aluminium, if a silicon semiconductor body is used.

Although the metal path is generally connected to a potential, and preferably to reference potential, the desired improvement, i.e. to reduce the parasitic effects and to achieve improved electrical separation of the elements is in some cases already achieved by means of a metal path which is not connected to a particular potential. The decisive factor is merely that the metal path follows a path on the surface of the semiconductor body with sufficient length or area without being separated from the semiconductor body by means of an insulating layer.

Referring now to the drawings, FIG. 1 shows an individual integrated circuit which is already separated from the other integrated circuits of a common semiconductor wafer. The integrated circuit in FIG. 1 contains a series of elements, which cannot be seen in the drawing, inside the semiconductor body. On the main surface of the integrated circuit, on the component side, the insulating layer 2 located on the semiconductor body 1 is seen as well as the metallic connecting paths 3 which serve for external bonding of the integrated circuit. On the right-hand side of the upper main surface 4 is located the metal path 5 provided in accordance with the invention, this metal path running not on the insulating layer 2 but on the semiconductor body along the righthand edge 6. The metal path 5 has a lateral extension 7 which opens out into a connecting pad 8. By means of the bonding pad 8, a connection may be made to a reference potential or an other potential. The metallic connecting pads 3 extend, as does the connecting pad 8, through openings in the insulating layer to the semiconductor body.

Figure 2:
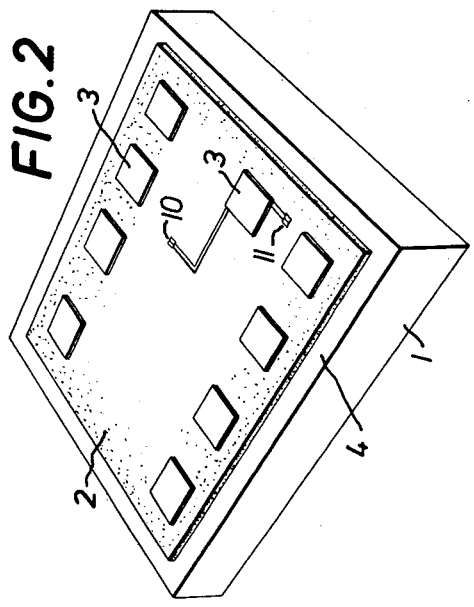
FIG. 2 is a perspective view similar to FIG. 1 but showing a prior art form.

The metal path 5 is provided in accordance with the invention has nothing to do with the conducting paths 9, which are present for example in accordance with FIG. 2 on the upper surface of integrated circuits. Because the conductive path 9 in FIG. 2 runs substantially on the insulating layer 2, in contrast to the metal path 5 of FIG. 1, and produces only an electrical conductive connection between different points (10, 11) of the semiconductor body or a connection to the connecting pad 3. In this feature the conducting path 9 of FIG. 2 runs substantially on the insulating layer 2 and has contact with the semiconductor body only at the relatively small connecting points (10, 11). In contrast to this the metal path 5 of FIG. 1 runs exclusively on the upper semiconductor surface and not on the insulating layer and maintains the condition that it should run on the semiconductor body over the majority of its length.

Figure 3:
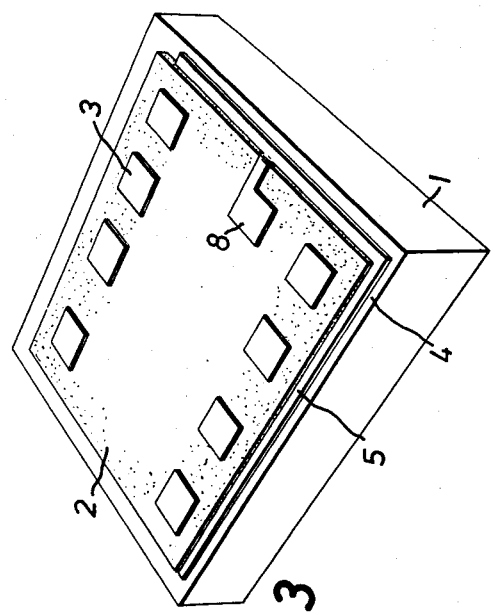
FIG. 3 is a view similar to FIG. 1 but showing a second embodiment of the invention.

The integrated circuit of FIG. 3 is distinguished from the integrated circuit of FIG. 1 by the fact that metal paths are present on two sides, and furthermore these are connected together and thus produce a right angled metal path 5. Also metal path 5 of FIG. 3 runs along the edges of the main surface of the semiconductor body on the component side. Moreover, the metal path 5 also has a connecting pad 8.

Figure 4:
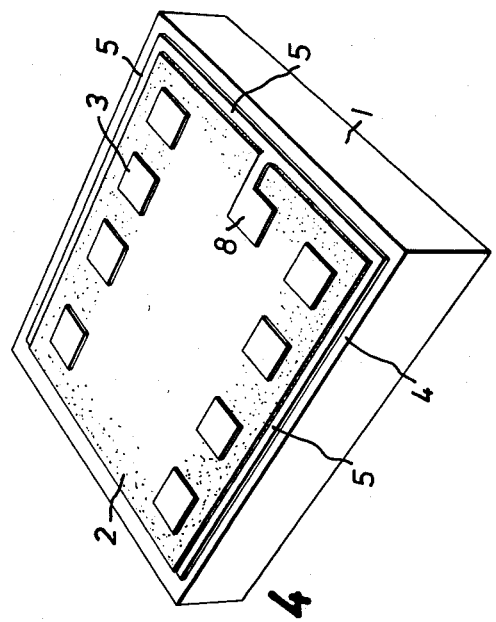
FIG. 4 is a view similar to FIG. 1 but showing a third embodiment of the invention.
Figure 5:
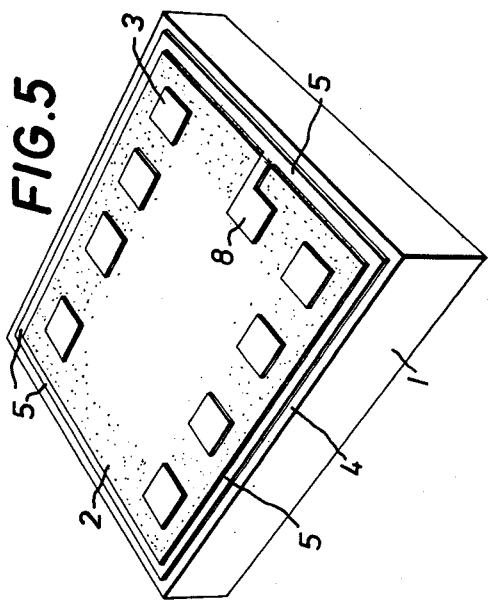
FIG. 5 is a view similar to FIG. 4 but showing a fourth embodiment of the invention.

The integrated circuit of FIG. 4 has a U-shaped metal path 5 which runs exclusively on the semiconductor body and at its edge. FIG. 5 shows an integrated circuit having a frame-like metal path 5 which completely encloses the components of the integrated circuit.

Figure 6:
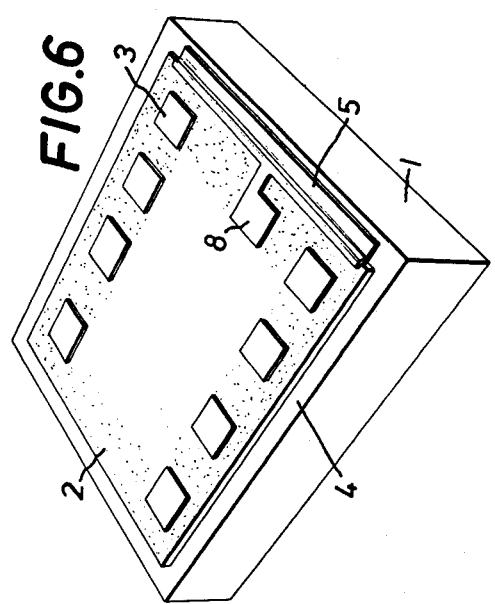
FIG. 6 is a view similar to FIG. 5 but showing a fifth embodiment of the invention.

While the metal paths 5 of the integrated circuit of FIGS. 1, 3, 4 and 5 run exclusively on the semiconductor body and thus not even partially on the insulating layer 2, FIG. 6 shows an arrangement in which a part of the metal path 5 runs on the insulating layer 2 and the other part of the metal path 5 runs on the semiconductor body. This different path is present over the entire length of the metal path 5 of FIG. 6.

Figure 7:
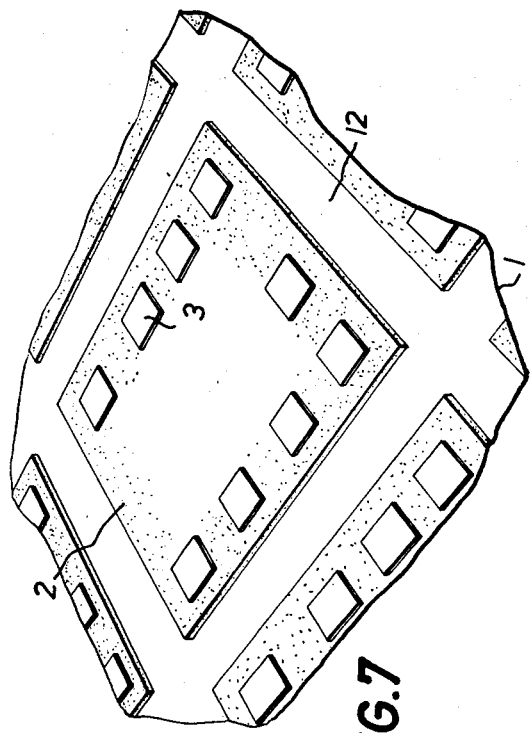
FIG. 7 is a perspective view of part of a semiconductor wafer prior to scribing.
Figure 8:
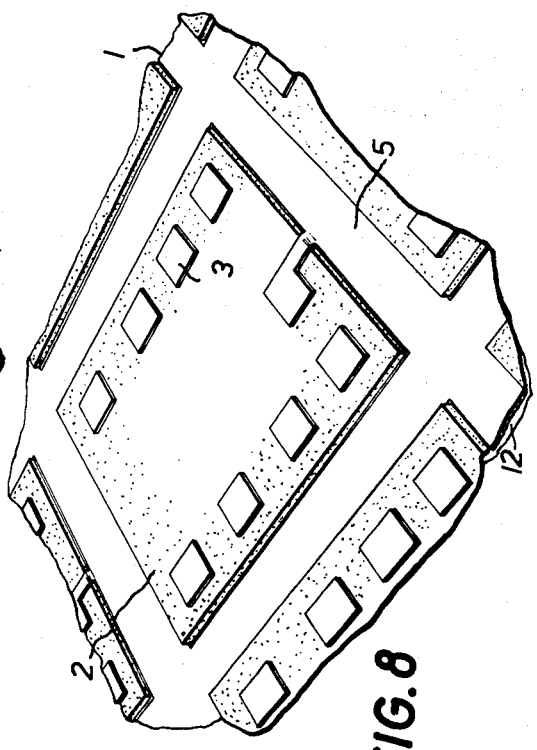
FIG. 8 is a view similar to FIG. 7 but showing the introduction of a metal path thereto in accordance with the invention.

FIGS. 7 and 8 show portions of a fairly large semiconductor wafer 1 having several integrated circuits. FIG. 7 shows recesses 12 in the insulating layer 2, these recesses exposing the semiconductor surface in the region in which the semiconductor wafer is scribed to facilitate breaking of the semiconductor wafer. Before scribing the metal paths 5 are introduced into the recesses 12 in accordance with FIG. 8. This occurs for example by vaporizing a metallic layer on the whole upper surface and by producing the metal paths 5 by means of etching this metallic layer. The other electrodes of the integrated circuit and, for example, the connecting pads 3 shown are also made at the same time as the metal paths 5.

When scribing the semiconductor wafer, it is necessary either to scribe through the metal path located in the scribing region or there is the opportunity to separate out a strip from the metal paths shown in FIG. 8 at the centre before scribing, so that scribing does not have to take place through the metal paths 5. Scribing takes place for example by means of a laser beam. The laser treatment may be used at the same time to alloy the metal of the metal paths 5 to the semiconductor body, the said metal comprising, for example aluminium.

It will be understood that the above description of the present invention is susceptible to various modification changes and adaptations.

What is claimed is:

1. In an integrated circuit arrangement including a semiconductor body having a plurality of electrically separated components formed therein adjacent one main surface and an insulating layer on said one main surface and covering said components except for openings for connections to same while leaving a part of said one main surface exposed, the improvement comprising: a metal path disposed on said one main surface with at least a portion of said metal path running directly on said exposed part of said one main surface of said semiconductor body and with said portion being longer than any portion of said metal path which runs exclusively on the surface of said insulating layer.

2. An integrated circuit as defined in claim 1 wherein said exposed part of said one main surface is adjacent the edge of said insulating layer, and said metal path runs along the edge of said one main surface of the semiconductor body.

3. An integrated circuit as defined in claim 1, wherein said metal path runs only on said one main surface of said semiconductor body over its entire length.

4. An integrated circuit as defined in claim 1, wherein said metal path runs along the edge of said one main surface of the semiconductor body.

5. An integrated circuit as defined in claim 1, wherein metal paths run along one, two, three or four lateral edges of said one main surface of the semiconductor body.

6. An integrated circuit as defined in claim 1, wherein metal paths run along, two, three and four lateral edges of said one main surface of the semiconductor body.

7. An integrated circuit as defined in claim 5, wherein said metal paths which run along the lateral edges of said semiconductor body are connected together to form a single metal path.

8. An integrated circuit as defined in claim 7, wherein said single metal path is right-angled.

9. An integrated circuit as defined in claim 7, wherein said single metal path is U-shaped.

10. An integrated circuit as defined in claim 7, wherein said single metal path is frame-like.

11. An integrated circuit as defined in claim 1, wherein said metal path runs in a recess which is provided in said insulating layer for enabling scribing of the semiconductor wafer.

12. An integrated circuit as defined in claim 1, wherein said metal path runs partially on said insulating layer present on said semiconductor body.

13. An integrated circuit arrangement as defined in claim 12, wherein said metal path runs on said insulating layer with one part and along the semiconductor body with another part.

14. An integrated circuit as defined in claim 1 and comprising conducting paths running to connecting points inside said one main surface from said metal path provided at an edge or edges of said one main surface.

15. An integrated circuit as defined in claim 14, wherein said conducting paths run on said insulating layer present on said semiconductor body.

16. An integrated circuit as defined in claim 1, wherein said semiconductor body comprises silicon and said metal path comprises aluminium.

17. An integrated circuit as defined in claim 1, wherein said metal path is connected to a potential.

18. An integrated circuit as defined in claim 1, wherein said metal path is connected to a reference potential.

19. An integrated circuit as defined in claim 1 and comprising a broadened-out connecting spot for said metal path in the form of a metal pad.

20. An integrated circuit as defined in claim 1 and comprising a wire connecting said metal path and a potential.

21. A method of producing an integrated circuit as defined in claim 1 and comprising producing recesses in an insulating layer on a semiconductor wafer from which said semiconductor body is to be separated thereafter introducing metal for said metal path at least into said recess; and then scribing said semiconductor wafer.

22. A method as defined in claim 21 and comprising separating said metal path by a separating trace which exposes the semiconductor surface for the purpose of scribing.

23. A method as defined in claim 21, wherein scribing takes place by means of a laser beam.

24. A method as defined in claim 21 and comprising alloying the metal of said metal path to the semiconductor body by means of laser treatment.

25. In an integrated circuit arrangement including a semiconductor body having a plurality of separated components formed therein adjacent one main surface and on insulating layer on said one main surface and covering said components, the improvement wherein means are provided for reducing parasitic effects and for improving the electrical separation between said components, said means consisting of: a metal path disposed on said one main surface with at least a portion of said metal path running on said one main surface of said semiconductor body in direct contact with same and with said portion being longer than any portion of said metal path which runs exclusively on the surface of said insulating layer.

* * * * *